(12) United States Patent
Hein et al.

(10) Patent No.: US 7,145,359 B2
(45) Date of Patent: Dec. 5, 2006

(54) MULTIPLE SIGNAL FORMAT OUTPUT BUFFER

(75) Inventors: Jerrell P. Hein, Driftwood, TX (US);
Bruce P. Del Signore, Hollis, NH (US);
Akhil K. Garlapati, Boston, MA (US)

(73) Assignee: Silicon Laboratories Inc., Austin, TX (US)

( * ) Notice: Subject to any disclaimer, the term of this patent is extended or adjusted under 35 U.S.C. 154(b) by 32 days.

(21) Appl. No.: 10/878,197

(22) Filed: Jun. 28, 2004

(65) Prior Publication Data
US 2005/0285629 A1 Dec. 29, 2005

(51) Int. Cl.
*H03K 19/173* (2006.01)

(52) U.S. Cl. .......................................... 326/38; 326/115

(58) Field of Classification Search .................. 326/38, 326/49, 115, 37, 39, 40; 327/109
See application file for complete search history.

(56) References Cited

U.S. PATENT DOCUMENTS

| | | | |
|---|---|---|---|
| 5,121,080 A | 6/1992 | Scott, III et al. | |
| 5,374,861 A | 12/1994 | Kubista | |
| 5,402,485 A | 3/1995 | Takato et al. | |
| 5,550,496 A | 8/1996 | Desroches | |
| 5,570,037 A | 10/1996 | Llorens | |
| 6,054,881 A | 4/2000 | Stoenner | |
| 6,147,520 A | 11/2000 | Kothandaraman et al. | |
| 6,280,011 B1 | 8/2001 | Schloeman et al. | |
| 6,281,702 B1 | 8/2001 | Hui | |
| 6,300,802 B1 | 10/2001 | Smetana | |
| 6,433,579 B1 * | 8/2002 | Wang et al. ............ | 326/38 |
| 6,437,599 B1 | 8/2002 | Groen | |
| 6,445,223 B1 | 9/2002 | Thilenius | |
| 6,504,397 B1 | 1/2003 | Hart et al. | |
| 6,580,292 B1 | 6/2003 | West et al. | |
| 6,603,329 B1 | 8/2003 | Wang et al. | |
| 6,664,814 B1 | 12/2003 | Evans et al. | |
| 6,670,830 B1 | 12/2003 | Otsuka et al. | |
| 6,700,403 B1 | 3/2004 | Dillon | |
| 6,744,275 B1 | 6/2004 | Chansungsan | |
| 6,812,734 B1 | 11/2004 | Shumarayev et al. | |
| 6,815,980 B1 | 11/2004 | Kerr | |
| 6,940,302 B1 | 9/2005 | Shumarayev et al. | |
| 6,963,219 B1 | 11/2005 | Ghia et al. | |
| 2005/0212553 A1 | 9/2005 | Best et al. | |

OTHER PUBLICATIONS

Goldie, John, "LVDS, CML, ECL-differential interfaces with odd voltages," http://www.planetanalog.com/ Jan. 21, 2003, 9 pages.

(Continued)

*Primary Examiner*—Daniel Chang
(74) *Attorney, Agent, or Firm*—Zagorin O'Brien Graham LLP

(57) ABSTRACT

An output buffer circuit drives multiple signal formats. The output buffer circuit reduces duplication of output bond pads on an integrated circuit die. The output buffer circuit reduces a need for including conversion buffers on system boards. A single integrated circuit including the output buffer circuit may meet a variety of applications. The output buffer achieves these results with a programmable output voltage swing and a programmable output common mode voltage. In some embodiments of the present invention, an integrated circuit includes at least one single-ended buffer and at least one differential circuit coupled to a pair of outputs. One of the single-ended buffer and the differential circuit is selectively enabled to provide a signal to the outputs.

38 Claims, 4 Drawing Sheets

OTHER PUBLICATIONS

Ju, Jeff, "Interfacing LVDS with other differential-I/O types," www.edn.com, Oct. 30, 2003, 4 pages.

MAXIM High-Frequency/Fiber Communications Group, "Introduction to LVDS, PECL, and CML," Application Note: HFAN-1.0, Rev. 0, Sep. 2000, pp. i-14.

Heydari, Payam, "Design Issues in Low-Voltage High-Speed Current-Mode Logic Buffers," *GLSVLSI'03*, Apr. 28-29, 2003, Washington, DC, USA, 6 pages.

Boni, Andrea, et al., "LVDS I/O Interface for Gb/s-per-Pin Operation in 0.35-μm CMOS," *IEEE Journal of Solid-State Circuits*, vol. 36, No. 4, Apr. 2001, pp. 706-711.

Chen, Mingdeng, et al., "Low-Voltage Low-Power LVDS Drivers," *IEEE Journal of Solid-State Circuits*, vol. 40, No. 2, pp. 472-479, Feb. 2005.

Kumeric, Marijan, et al., "Digitally tuneable on-chip line termination resistor for 2.6Gbit/s LVDS receiver in 0.25μ standard CMOS technology," in *Proceedings of the 27th European Solid-State Circuits Conference (ESSCIRC 2001)*, Sep. 18-20, 2001, pp. 241-244.

"HiPerClockS (TM) Application Note, 3.3V LVPECL Driver Termination," Integrated Circuit Systems, Inc., Aug. 2, 2002, 7 pages, retrieved from URL www.icst.com/products/hiperclocks.html.

Ma, Jimmy, "Termination Schemes and Design Guidelines for 3.3V LVPECL Driver," Application Note #73, Pericom Semiconductor Corporation, San Jose, CA, May 19, 2004, 2 pages, retrieved from URL www.pericom.com.

Micrel Semiconductor, "High-Speed PECL and LVPECL Termination," (no date) 2 pages, retrieved from URL www.micrel.com/solutions.shtml.

"Optimizing Design and Layout for the Si5318/20/21/64 Clock ICs," Silicon Laboratories Product Sheet AN59, Rev. 1.0, Jun. 2005, 20 pages.

Von Herzen, Brian and Brunetti, Jon, "Virtex-E LVPECL Receivers in Multi-Drop Applications," XILINX Application Note: Virtex-E Family, Feb. 24, 2000, 8 pages, XAPP237, v1.1, retrieved from URL www.xilinx.com.

Yang, Ken, "Modified LDO Regulator Sinks PECL-Termination Current," Planet Analog, Jun. 28, 2005, 4 pages, retrieved Sep. 2, 2005 from URL http://www.planetanalog.com/showArticle?articleID=164903593.

* cited by examiner

MULTIPLE SIGNAL FORMAT OUTPUT BUFFER

BACKGROUND

1. Field of the Invention

The present invention relates to integrated circuits, and more particularly to output buffers of integrated circuits.

2. Description of the Related Art

Devices producing clocks for use in a system may communicate with a variety of types of input buffers, each type having its own impedance, signal swing, and common mode requirements. Traditionally, clock source integrated circuits produce outputs which have a predetermined signal format, thus integrated circuit designers have used various techniques to provide an interface between the input and output buffers having different signal formats.

For example, an integrated circuit may provide multiple output signal formats by including duplicate output bond pads. Each bond pad (or pair of pads for differential formats) has a corresponding output buffer circuit. During a packaging process, the desired pads are bonded to package pins and the unconnected pads and buffer are unused. While this approach allows one integrated circuit to generate multiple signal formats, extra area is consumed by the unused buffer and pads, and the signal format must be selected during the packaging process.

Another technique for providing an interface between input and output buffers having different signal formats includes designing separate integrated circuits for each output signal format to avoid wasting die area of unused buffer(s). This approach introduces additional mask costs if the designs are processed on separate mask sets. Like the former technique, the signal format must be selected during the packaging process. Both of the former and latter techniques require additional inventory because stock must be kept for each part number.

Conversion buffers may be used to provide an interface between input and output buffers having different signal formats. This approach allows one integrated circuit to be used in multiple applications requiring different numbers and types of loads. However, conversion buffers introduce the costs of additional board space and additional clock jitter. For high precision applications, the buffer jitter can significantly degrade system performance.

Accordingly, improved techniques for communicating between an output buffer and an input buffer having different signal formats are desired.

SUMMARY

An output buffer circuit drives multiple signal formats. The output buffer circuit reduces duplication of output bond pads on an integrated circuit die. The output buffer circuit reduces a need for including conversion buffers on system boards. A single integrated circuit including the output buffer circuit may meet a variety of applications. The output buffer achieves these results with a programmable output voltage swing and a programmable output common mode voltage.

In some embodiments of the present invention, an integrated circuit includes at least one single-ended circuit coupled to at least one of a pair of outputs and at least one differential circuit coupled to the pair of outputs. One of the single-ended circuit and the differential circuit is selectively enabled to provide a signal to the outputs.

In some embodiments of the present invention, an integrated circuit includes a pair of multi-standard outputs. The multi-standard outputs provide at least one signal having a programmable output voltage swing and a programmable common mode voltage.

In some embodiments of the present invention, an integrated circuit includes a regulated voltage supply node, a first differential input node, a second differential input node, a first differential output node, a second differential output node, a first load coupled to the first differential output node and the regulated voltage supply node, a second load coupled to the second differential output node and the regulated voltage supply node, and a differential circuit coupled to the input nodes and the output nodes. A voltage swing and a common mode voltage of a differential signal received by the output nodes is varied by at least a programmable voltage signal on the regulated voltage supply node and a programmable current flowing through the loads.

In some embodiments of the present invention, a method includes providing a signal selected from a differential signal and a single-ended signal to at least one of a pair of outputs. The method may include selectively configuring a single-ended circuit and a differential circuit to provide a signal to at least one of a pair of outputs. The signal may be selected from a differential signal and a single-ended signal. The method may include balancing a load on individual ones of the pair of outputs coupled to receive the selected signal.

In some embodiments of the present invention, a method includes providing a pair of outputs with an output signal compliant with an output standard selected from a plurality of output standards. Individual ones of the output standards include a corresponding output common mode voltage and a corresponding output voltage swing. The method may include configuring a voltage supply based at least in part on an output standard. The voltage supply controls a common mode voltage of an output signal. The method may include configuring currents through differential output nodes based at least in part on the selected output standard. The current controls a voltage swing of the output signal.

In some embodiments of the present invention, a method of manufacturing an integrated circuit product includes forming a regulated voltage supply node, forming a first differential input node and a second differential input node, forming a first differential output node and a second differential output node, forming a first load coupled to the first differential output node and the regulated voltage supply node, forming a second load coupled to the second differential output node and the regulated voltage supply node, and forming a differential circuit coupled to the input nodes and the output nodes. A voltage swing and a common mode voltage of a differential signal received by the output nodes is varied by at least a programmable voltage signal on the regulated voltage supply node and a programmable current flowing through the output nodes.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1A:
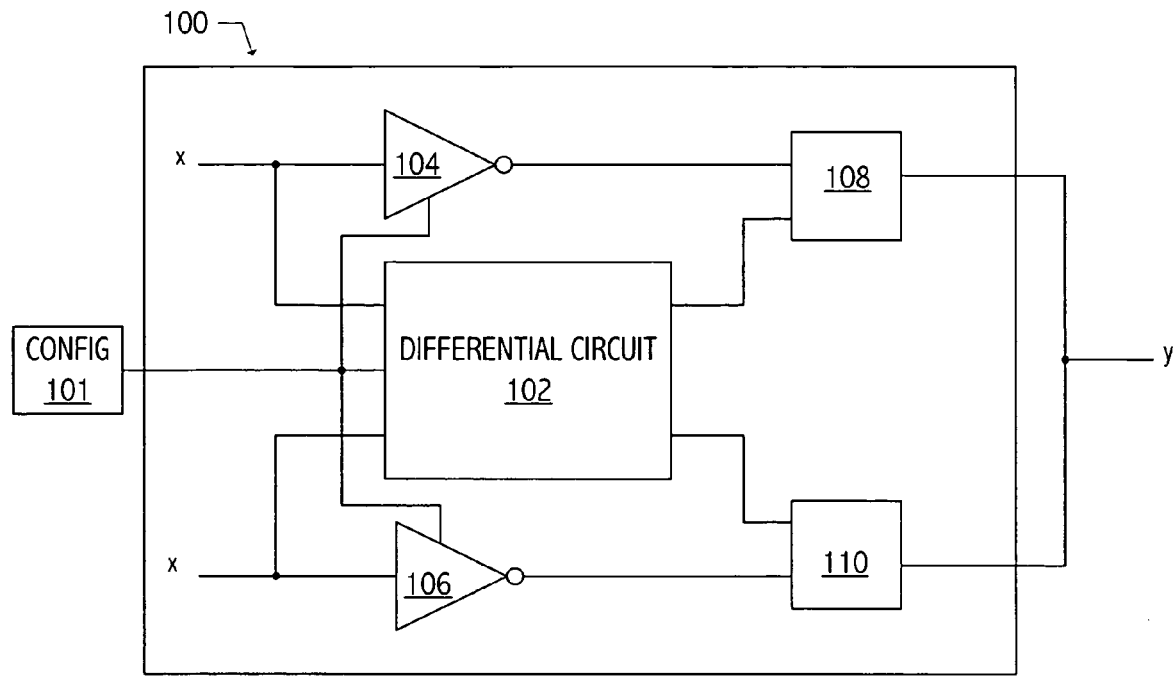
FIG. 1A illustrates an output buffer circuit consistent with some embodiments of the present invention.
Figure 1B:
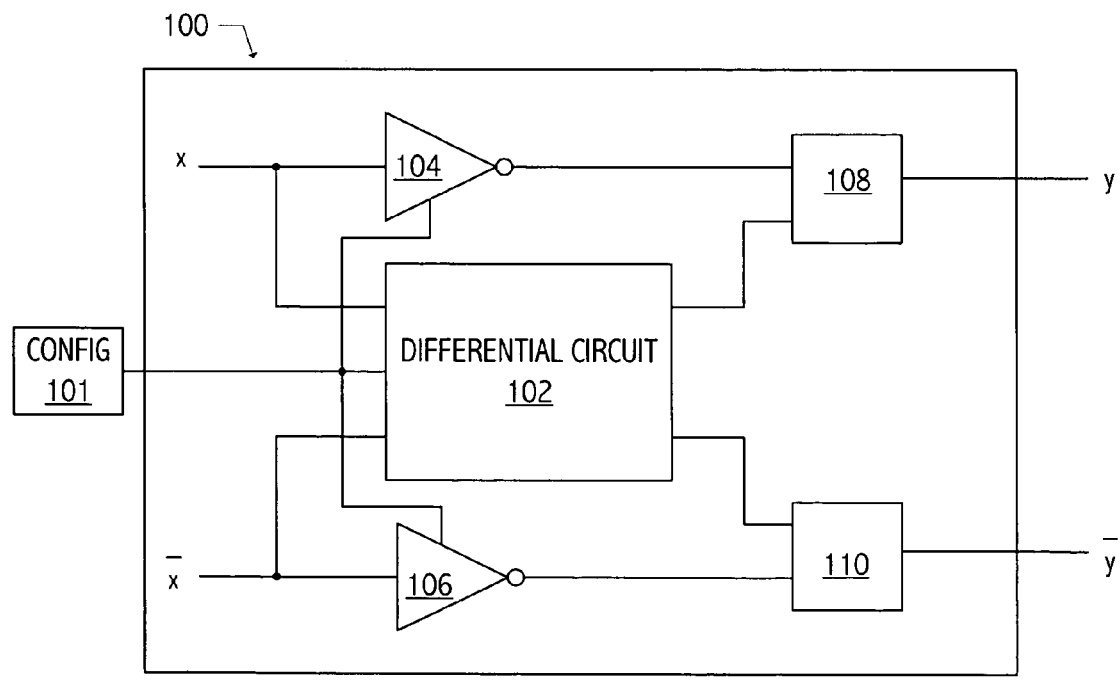
FIG. 1B illustrates an output buffer circuit consistent with some embodiments of the present invention.

FIGS. 1A and 1B illustrate integrated circuit 100, which may be an output portion of a microprocessor, a clock source integrated circuit, or other integrated circuit product. Integrated circuit 100 supports a CMOS mode, i.e., a single-ended mode, a mode in which a single input signal produces a single output, e.g., as configured in FIG. 1A. Integrated circuit 100 also supports a differential mode, i.e., a differential input produces a differential output, e.g., as configured in FIG. 1B. The mode of integrated circuit 100 may be selected by configuration block 101, e.g., digital logic, non-volatile memory control, or other suitable technique. In the CMOS mode, the inputs received by CMOS drivers 104 and 106 are in phase, as illustrated by the input 'x', which drives both CMOS driver 104 and 106 to produce an output 'y'. In the differential mode, the inputs received by differential circuit 102 are out of phase, as illustrated by the input 'x' and 'x̄', which drive differential circuit 102 to produce outputs 'y' and 'ȳ'. Integrated circuit 100 includes bond pads 108 and 110, which are typical conductors used to provide connections external to integrated circuit 100. CMOS drivers 104 and 106 are selectively enabled to drive bond pads 108 and 110, respectively in a CMOS mode.

Figure 2:
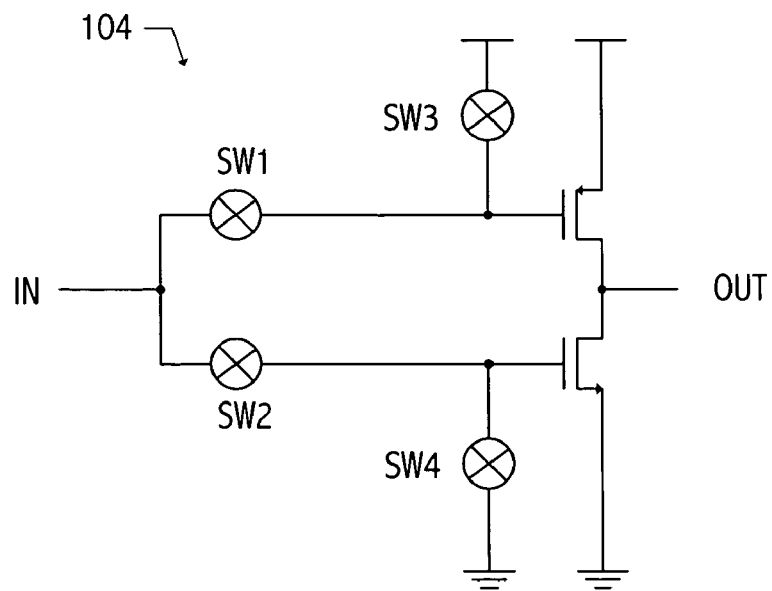
FIG. 2 illustrates a CMOS driver circuit consistent with some embodiments of the present invention.

An exemplary CMOS driver is illustrated in FIG. 2. Switches SW1, SW2, . . . , SW4 may be configured according to configuration block 101. In CMOS mode, switches SW1 and SW2 are closed and switches SW3 and SW4 are open, providing an output y=x̄. In differential mode, switches SW1, and SW2 are open and SW3 and SW4 are closed, producing a high impedance output of CMOS driver 104. In differential mode, differential circuit 102 drives bond pads 108 and 110 with a differential signal, i.e., two signals, an individual one of the signals being out of phase with respect to the other signal. Bond pads 108 and 110 provide a differential signal off-chip, e.g., the differential signal y and ȳ.

A single CMOS driver may be sized to provide an appropriate drive strength, e.g., CMOS driver 104, may be coupled to a single bond pad, e.g., bond pad 108, and the other bond pad, e.g., bond pad 110, may be unused in CMOS mode. In both CMOS mode and differential mode, CMOS driver 104 loads a node coupled to OUT and may result in unequal loading of bond pads 108 and 110. However, the loading on bond pads 108 and 110 may be balanced by including two CMOS drivers, e.g., CMOS drivers 104 and 106, each providing half-sized loads, introducing an equivalent load at each of the bond pads 108 and 110. Bond pads 108 and 110 may be coupled externally to provide a single output y.

An exemplary differential circuit, i.e., differential circuit 102, supports a plurality of output formats, e.g., CML (current-mode logic), LVDS (low-voltage differential signaling), and LVPECL (low-voltage positive emitter-coupled logic), specifying common mode voltages and output swing voltages. Typical specifications for these output standards are summarized in Table 1.

TABLE 1

Typical Specifications for Representative Output Standards

| Parameter | LVDS | LVPECL (Input Standard) | LVPECL (Output Standard) | CML |
|---|---|---|---|---|
| $V_{OH}$ | <2.4 V | $V_{CC} - 1.16$ V < $V_{OH}$ < $V_{CC} - 0.88$ V | $V_{CC} - 1.025$ V < $V_{OH}$ < $V_{CC} - 0.88$ V | <$V_{CC} + 0.2$ V |
| $V_{OL}$ | >0 V | $V_{CC} - 1.81$ < $V_{OL}$ < $V_{CC} - 1.48$ | $V_{CC} - 1.81$ V < $V_{OL}$ < $V_{CC} - 1.62$ V | >$V_{CC} - 0.6$ V |
| $V_{OD}$ | >100 mV | — | — | 400 mV < $V_{OD}$ < 1200 mV |

The standards summarized in Table 1 are exemplary only and are not intended to be limiting. Circuits associated with the invention described herein may be modified to comply with various other specifications having other voltage specifications.

Differential circuit 102 produces a high impedance output in CMOS mode or in a low power sleep mode. In differential mode, differential circuit 102 provides differential signal y and ȳ having an output common mode voltage and an output voltage swing based on a selected specification (e.g., CML, LVDS, or LVPECL). Configuration block 101 may configure differential circuit 102 for a particular specification by digital logic, non-volatile memory control, or other suitable techniques.

Figure 3:
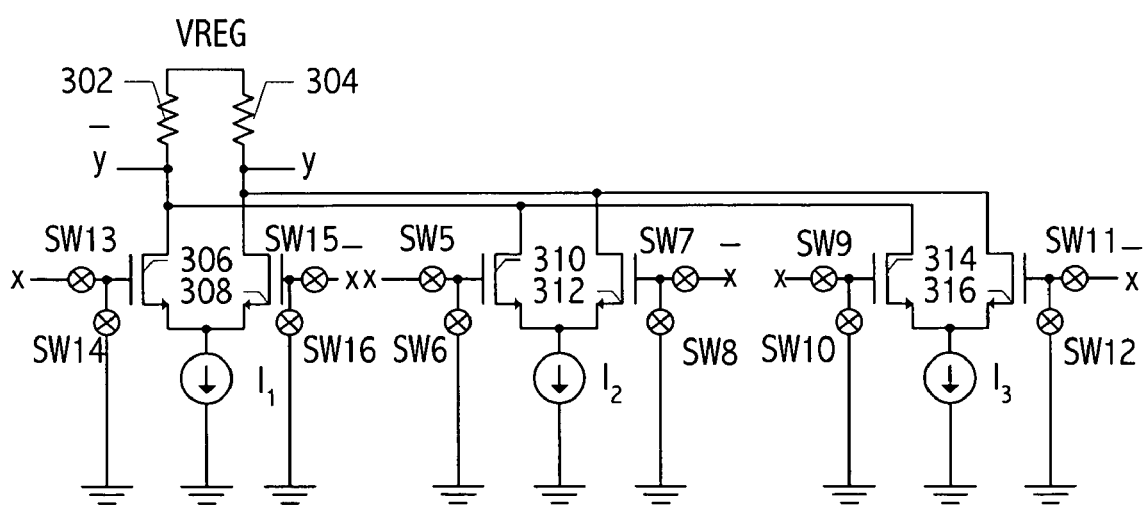
FIG. 3 illustrates a differential circuit consistent with some embodiments of the present invention.

An exemplary differential circuit 102 is illustrated in FIG. 3. During typical operation, SW13 and SW15 are closed and SW14 and SW16 are open, enabling transistors 306 and 308. In some embodiments of the present invention, additional transistors may be coupled between the differential pair formed by transistors 306 and 308 and load devices, e.g., resistors 302 and 304, in a cascode configuration. If the manufacturing technology affords it, such cascode devices could be of a same type or different type (e.g., high voltage, different $V_t$) as transistors 306 and 308.

A differential input, i.e., x and x̄, e.g., a differential "square" wave varying from a quiescent voltage by $+\Delta V_{IN}$ and $-\Delta V_{IN}$, respectively, is applied to differential circuit 102. The current in the left branch, i.e., the current through resistor 302, increases by $+\Delta I$ because $V_{GS306}$, increases and the current in the right branch, i.e., the current through resistor 304, decreases by $-\Delta I$ because $V_{GS308}$ decreases. Accordingly, $V_y$ decreases from the common mode voltage and $V_{\bar{y}}$ increases from the common mode voltage. For a predetermined input range, e.g., $V_{xMIN} \leq (V_x, V_{\bar{x}}) \leq V_{xMAX}$, the output voltage varies $V_{yMIN} \leq (V_y, V_{\bar{y}}) \leq V_{yMAX}$, i.e., the output voltage swing is $V_{OD} = V_{yMAX} - V_{yMIN}$. The output voltage swing of differential circuit 102 may be varied by selectively enabling additional differential pairs using switches SW5, SW6, . . . , SW12, e.g., the differential pair formed by transistors 310 and 312 and the differential pair formed by transistors 314 and 316, which are coupled to the output nodes y and $\bar{y}$.

Switches SW5, SW6, . . . , SW16 may be configured according to configuration block 101 and may be any suitable switching device that support an 'open' and 'closed' mode. For example, switches SW5, SW6, . . . , SW16 may be a MOSFET switch. In operation, when SW5 is open, and SW6 is closed, x is decoupled from the gate of transistor 310 and the gate of transistor 310 coupled to ground, effectively disabling transistor 310. The current flowing through the loads may be increased from $I_1$ to $I_1+I_2$ by opening switches SW6 and SW8, and closing switches SW5 and SW7. The additional current, $I_2$, will be driven by transistors 310 and 312 to flow through resistors 302 and 304 according to the values of x and $\bar{x}$. Similarly, an additional current, $I_3$ may be introduced by switches SW9, SW10, SW11, and SW12 to be steered by transistors 314 and 316 through the left and right loads according to the values of x and $\bar{x}$.

Increasing the currents through the left and right loads according to the values of x and $\bar{x}$ increases the differential between the currents flowing through the branches. The increased differential current produces a proportional increase in differential voltages, $V_y$ and $V_{\bar{y}}$, increasing the output voltage swing. By appropriately sizing transistors 306, 308, . . . , 316 and current sources $I_1$, $I_2$, and $I_3$, output voltage swings consistent with various specifications may be achieved. Switches SW5, SW6, . . . , SW16 may selectively configure differential circuit 102 to provide a differential output on pads 108 and 110 for a particular standard according to a mode indicated by configuration block 101, e.g., digital logic, non-volatile memory control, or other suitable technique. Switches SW5, SW6, . . . , SW16 may also be configured to disable the current sources $I_1$, $I_2$, and $I_3$, for a sleep mode in which only at most negligible currents flow through the left and right loads.

Figure 4:
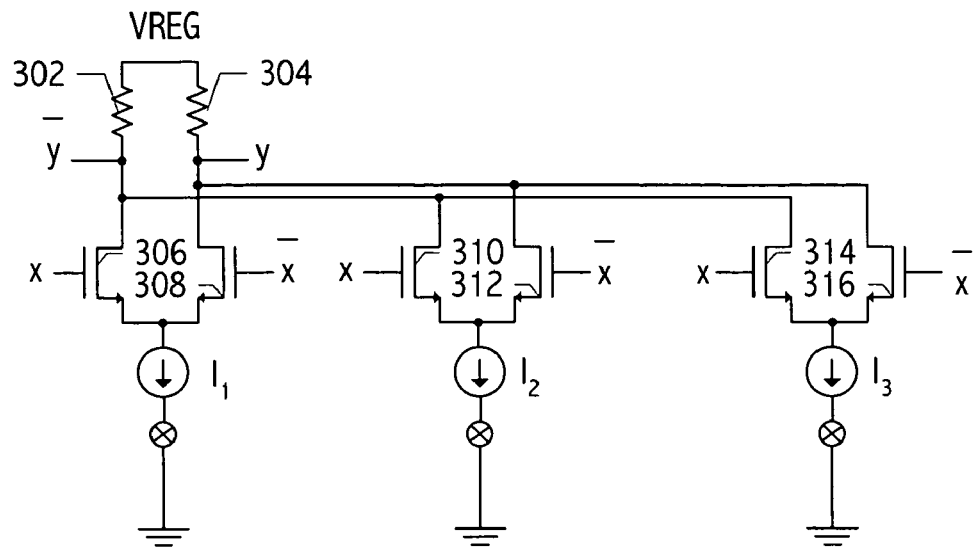
FIG. 4 illustrates a differential circuit consistent with some embodiments of the present invention.
Figure 5:
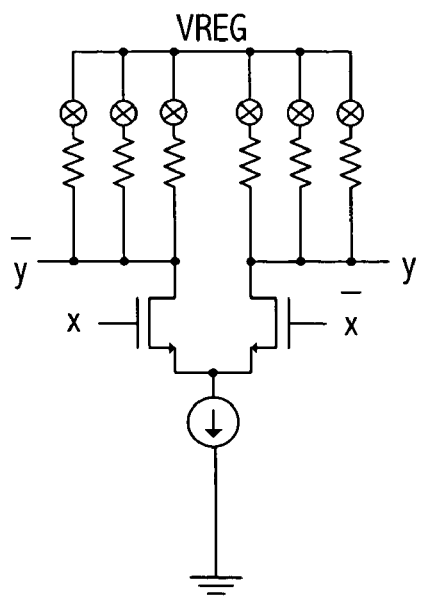
FIG. 5 illustrates a differential circuit consistent with some embodiments of the present invention.
Figure 6:
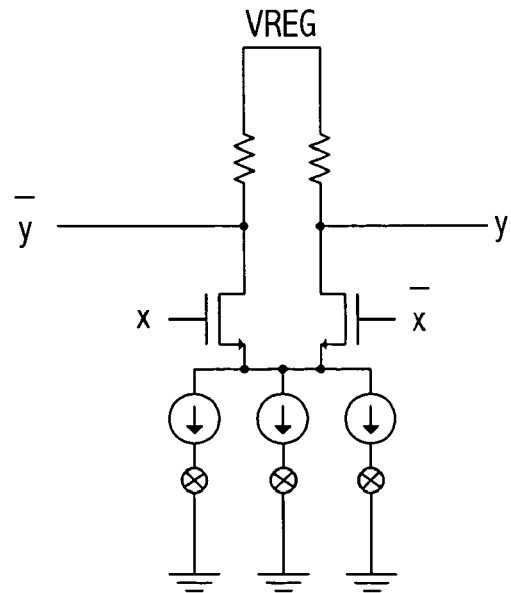
FIG. 6 illustrates a differential circuit consistent with some embodiments of the present invention.

In some embodiments of the present invention, switches selectively couple the current source to the differential pair to enable the differential pair (FIG. 4). In some embodiments of the present invention, alternative or additional loads may be selectively coupled to the output nodes (FIG. 5). In addition, alternative or additional current sources may be selectively coupled to a differential pair (FIG. 6).

Figure 7:
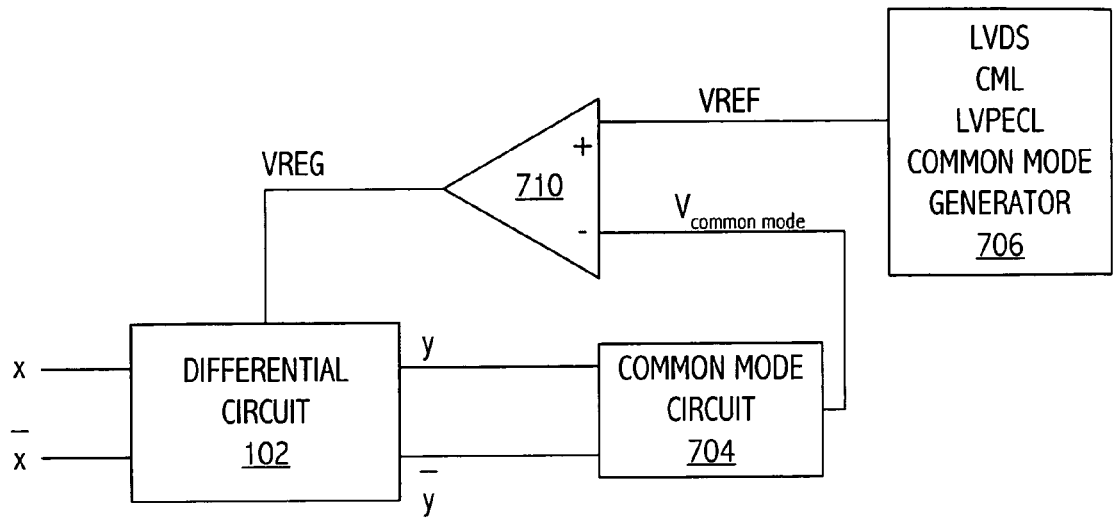
FIG. 7 illustrates a differential circuit coupled to a regulated voltage supply circuit consistent with some embodiments of the present invention.

Changes to a regulated voltage supply, e.g., $V_{REG}$, adjust the common mode voltage of y and $\bar{y}$, e.g., $V_{COMMON\ MODE}$. The output voltage swing of y and $\bar{y}$ is adjusted by changing the current flowing through the loads of differential circuit 102. Referring to FIG. 7, the regulated voltage supply, e.g., $V_{REG}$, is controlled by a feedback loop including common mode generator 706. Common mode generator 706 provides regulated voltages according to a selected standard (e.g., CML, LVDS, or LVPECL). Typically, the regulated voltages are generated by a controlled current flowing through a resistor, but any suitable technique for generating regulated voltages may be used. Common mode circuit 704 performs an averaging function on y and $\bar{y}$, i.e., $$V_{common\ mode} = \frac{y + \bar{y}}{2}.$$

This function may be performed by a continuous-time method, typically used for high-speed circuits, or by a switched-capacitor method. Operational amplifier 710 compares the voltage provided by common mode generator 706 to a common mode voltage of y and $\bar{y}$, provided by common mode circuit 704. Operational amplifier 710 adjusts $V_{REG}$ to reduce the common mode error. This feedback loop ensures that the output common mode voltage of differential circuit 102 meets the selected specifications.

Figure 8:
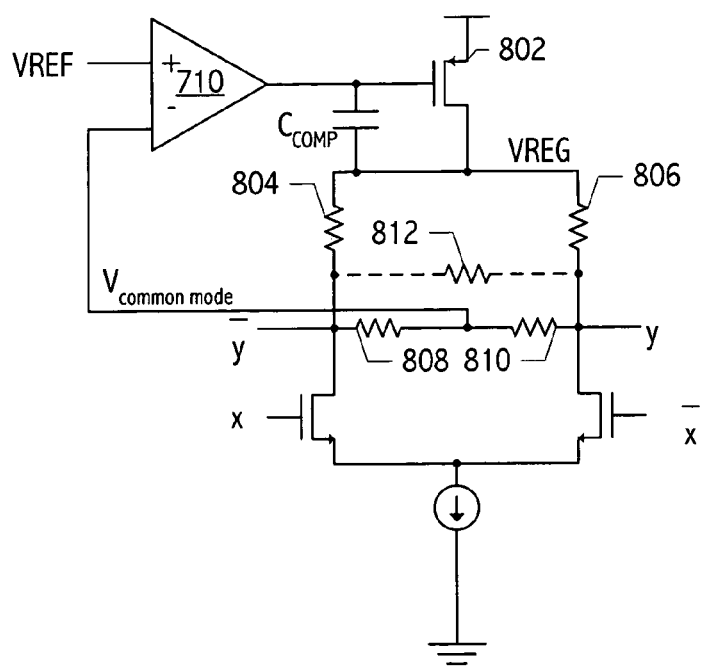
FIG. 8 illustrates a differential circuit coupled to a regulated voltage supply circuit consistent with some embodiments of the present invention.

Referring to FIG. 8, in some embodiments of the present invention, common mode circuit 704 is implemented with a resistor network, e.g., the resistor network formed by resistor 808 and resistor 810. Outputs y and $\bar{y}$ may be coupled to an external load e.g., resistor 812. The external load may receive 66% of the current, the remaining 33% of the current flowing through resistor 804 and resistor 806. The external current (i.e., a current based on external resistor 812) reduces the effects of process variations. A series regulator, e.g., transistor 802, may be controlled by the output of operational amplifier 710 and coupled to a capacitor, e.g., $C_{COMP}$, which helps maintain the stability of the regulated voltage, $V_{REG}$.

In an exemplary embodiment, three differential pairs are selectively enabled to realize the LVDS, LVPECL, and CML standards, as summarized in Table 2.

TABLE 2

Summary of Differential Circuit Configurations

| Standard | Current | VREG |
| --- | --- | --- |
| LVDS | $I_1$ | 1.55 V |
| LVPECL (input standard) | $I_1 + I_2$ | $V_{DD}$ − 0.6 V |
| LVPECL (output standard) | $I_1 + I_2 + I_3$ | $V_{DD}$ − 0.25 V |
| CML | $I_1$ | $V_{DD}$ |
| LVDS (high swing) | $I_1 + I_2$ | 1.9 V |

Based on the above configurations of differential circuit 102, the common mode voltages and output swing voltages in Table 1 may be achieved.

Integrated circuit 100 supports multiple output signal formats, e.g., those summarized above without the need for bond pads other than 108 and 110. A system board including integrated circuit 100 need not include conversion buffers. Integrated circuit 100 may be manufactured, stocked, and supplied for various applications. Power saving signal formats may be selected at the system level, to reduce overall system power. For example a reduced swing format may be used if a clock source and load are close to each other on the board, thus reducing power and electromagnetic interference generated by the board.

While circuits and physical structures are generally presumed, it is well recognized that in modern semiconductor design and fabrication, physical structures and circuits may be embodied in computer readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

What is claimed is:

1. An integrated circuit comprising:
   a regulated voltage supply node;
   a first input node and a second input node;
   a differential output node comprising a first output node and a second output node;
   a first load coupled between the first output node and the regulated voltage supply node;
   a second load coupled between the second output node and the regulated voltage supply node;
   a differential amplifier circuit coupled to the input nodes and the differential output node,
   wherein the differential amplifier circuit comprises a plurality of differential pairs of devices, individual ones of the plurality of differential pairs of devices being selectively enabled by respective ones of a plurality of switch circuits to generate a differential signal on the differential output node based at least in part on signals on the first and second input nodes; and
   wherein a voltage swing and a common mode voltage of the differential signal vary based on at least a programmable voltage signal on the regulated voltage supply node and a programmable current flowing through the loads.

2. The integrated circuit, as recited in claim 1, wherein the differential signal is programmable to be compliant with one of a plurality of output standards.

3. The integrated circuit, as recited in claim 2, wherein the plurality of output standards includes a first output standard and a second output standard, the first and second output standards having common mode voltages that differ by at least approximately 1.0V.

4. The integrated circuit, as recited in claim 2, wherein the plurality of output standards includes a first output standard and a second output standard, the first and second output standards having output voltage swings that differ by at least approximately 500 mV.

5. The integrated circuit, as recited in claim 1, wherein the differential signal is programmable to configure the output nodes in a high impedance state.

6. The integrated circuit, as recited in claim 1, wherein the differential signal is programmable to be LVPECL standard-compliant, the differential signal is programmable to be LVDS standard-compliant, and the differential signal is programmable to be CML standard-compliant.

7. The integrated circuit, as recited in claim 1, further comprising:
   a first port and a second port coupled to respective ones of the first and second output nodes, wherein the first and second ports are responsive to a signal selected from a differential signal and a single-ended signal.

8. The integrated circuit, as recited in claim 7, further comprising:
   at least one single-ended circuit coupled to the first port and the second port; and
   wherein the single-ended circuit and the differential amplifier circuit are selectively coupled to provide the signal to at least one of the first port and the second port.

9. The integrated circuit, as recited in claim 8, wherein the single-ended circuit provides the single-ended signal to at least one of the first port and the second port and the differential circuit provides the differential signal to the first port and the second port.

10. The integrated circuit, as recited in claim 8, wherein the single-ended circuit loads individual ones of the first port and the second port with substantially equivalent loads.

11. The integrated circuit, as recited in claim 8, wherein the differential amplifier circuit provides an output signal having a programmable output voltage swing and a programmable output common mode voltage.

12. The integrated circuit, as recited in claim 1, wherein the differential amplifier circuit further comprises the plurality of switch circuits, the plurality of switch circuits being coupled to corresponding ones of the plurality of differential pairs of devices.

13. The integrated circuit, as recited in claim 12, wherein the switch circuits are responsive to at least one control signal based at least in part on a target output standard.

14. The integrated circuit, as recited in claim 1, wherein the differential amplifier circuit further comprises the plurality of switch circuits, the plurality of switch circuits being coupled to corresponding current sources coupled to individual ones of the plurality of differential pairs of devices.

15. An integrated circuit comprising:
   a regulated voltage supply node;
   a first input node and a second input node;
   a differential output node comprising a first output node and a second output node;
   a first load coupled between the first output node and the regulated voltage supply node;
   a second load coupled between the second output node and the regulated voltage supply node;
   a differential amplifier circuit coupled to the input nodes and the differential output node;
   a common mode circuit coupled to the output nodes, the common mode circuit coupled to provide a common mode voltage of a signal received by the output nodes;
   a common mode generator coupled to provide a programmable voltage; and
   an operational amplifier coupled to the common mode circuit, the common mode generator, and the regulated voltage supply node, the operational amplifier being responsive to at least the common mode voltage and the programmable voltage to reduce a common mode error of the signal received by the output nodes;
   wherein the differential amplifier circuit comprises a plurality of differential pairs of devices, individual ones of the plurality of differential pairs of devices being selectively enabled to generate a differential signal on the differential output node based at least in part on signals on the first and second input nodes; and
   wherein a voltage swing and a common mode voltage of the differential signal vary based on at least a programmable voltage signal on the regulated voltage supply node and a programmable current flowing through the loads.

16. An integrated circuit comprising:
   a regulated voltage supply node;
   a first input node and a second input node;
   a differential output node comprising a first output node and a second output node;
   a first load coupled between the first output node and the regulated voltage supply node;
   a second load coupled between the second output node and the regulated voltage supply node;
   a differential amplifier circuit coupled to the input nodes and the differential output node,
   wherein the differential amplifier circuit comprises a differential pair of devices coupled to the differential output node, the differential pair of devices being coupled to a plurality of current sources, the current sources being selectively enabled by respective ones of a plurality of switch circuits to vary the current through the loads;

wherein a voltage swing and a common mode voltage of a differential signal received by the differential output node vary based on at least a programmable voltage signal on the regulated voltage supply node and programmable currents flowing through the loads.

17. The integrated circuit, as recited in claim 16, wherein the differential amplifier circuit further comprises the plurality of switch circuits, the plurality of switch circuits being coupled to corresponding ones of the plurality of current sources.

18. The integrated circuit, as recited in claim 16, further comprising:
a common mode circuit coupled to the output nodes, the common mode circuit coupled to provide a common mode voltage of a signal received by the output nodes;
a common mode generator coupled to provide a programmable voltage; and
an operational amplifier coupled to the common mode circuit, the common mode generator, and the regulated voltage supply node, the operational amplifier being responsive to at least the common mode voltage and the programmable voltage to reduce a common mode error of the signal received by the output nodes.

19. The integrated circuit, as recited in claim 16, wherein the differential signal is programmable to be LVPECL standard-compliant, the differential signal is programmable to be LVDS standard-compliant, and the differential signal is programmable to be CML standard-compliant.

20. A method comprising:
providing a pair of outputs with an output signal compliant with an output standard selectable from a plurality of output standards, individual ones of the output standards including a corresponding output common mode voltage and a corresponding output voltage swing;
configuring a voltage supply based at least in part on a selected one of the output standards, the voltage supply controlling a common mode voltage of the output signal;
configuring currents through differential output nodes based at least in part on the selected output standard, the current controlling a voltage swing of the output signal; and
providing a plurality of differential pairs of devices selectively enabled by respective ones of a plurality of switch circuits to generate the output signal.

21. The method, as recited in claim 20, wherein the configuring the voltage supply further comprises:
adjusting the common mode voltage of the output signal based at least in part on the common mode voltage of the output signal and a desired common mode voltage of the output signal corresponding to the selected output standard.

22. The method, as recited in claim 21, wherein the adjusting reduces a common mode error.

23. The method, as recited in claim 20, wherein the output standard is selected from an LVPECL standard, an LVDS standard, and a CML standard.

24. The method, as recited in claim 20, wherein the output standard includes a high impedance output state.

25. The method, as recited in claim 20, wherein the output signal is selectable from a differential signal and a single-ended signal.

26. The method, as recited in claim 25, wherein the providing further comprises:
selectively configuring a single-ended circuit and a differential circuit to provide the output signal to at least one of the pair of outputs.

27. The method, as recited in claim 25, further comprising:
balancing a load on individual ones of the pair of outputs.

28. A method of manufacturing an integrated circuit product, the method comprising:
forming a regulated voltage supply node;
forming a first input node and a second input node;
forming a differential output node comprising a first output node and a second output node;
forming a first load coupled between the first output node and the regulated voltage supply node;
forming a second load coupled between the second output node and the regulated voltage supply node;
forming a differential amplifier circuit coupled to the input nodes and the differential output node,
wherein the differential amplifier circuit comprises a plurality of differential pairs of devices, individual ones of the plurality of differential pairs of devices being selectively enabled by respective ones of a plurality of switch circuits to generate a differential signal on the differential output node based at least in part on the signals on the first and second input node, and
wherein a voltage swing and a common mode voltage of the differential signal vary based on at least a programmable voltage signal on the regulated voltage supply node and programmable currents flowing through the loads.

29. The method, as recited in claim 28, wherein the differential signal is programmable to be compliant with one of a plurality of output standards.

30. The method, as recited in claim 28, wherein the differential signal is programmable to be LVPECL standard-compliant, the differential signal is programmable to be LVDS standard-compliant, and the differential signal is programmable to be CML standard-complaint.

31. The method, as recited in claim 28, wherein the differential amplifier circuit further comprises the plurality of switch circuits, the plurality of switch circuits being coupled to corresponding ones of the plurality of differential pairs of devices.

32. The method, as recited in claim 31, wherein the switch circuits are responsive to at least one control signal based at least in part on a target output standard.

33. The method as recited in claim 28, wherein the differential amplifier circuit further comprises the plurality of switch circuits, the plurality of switch circuits being coupled to corresponding current sources coupled to individual ones of the plurality of differential pairs of devices.

34. A method of manufacturing an integrated circuit product, the method comprising:
forming a regulated voltage supply node;
forming a first input node and a second input node;
forming a differential output node comprising a first output node and a second output node; p1 forming a first load coupled between the first output node and the regulated voltage supply node;
forming a second load coupled between the second output node and the regulated voltage supply node;
forming a differential amplifier circuit coupled to the input nodes and the differential output node;

forming a common mode circuit coupled to the output nodes, the common mode circuit coupled to provide a common mode voltage of a signal received by the output nodes;

forming a common mode generator coupled to provide a programmable voltage; and forming an operational amplifier coupled to the common mode circuit, the common mode generator, and the regulated voltage supply node, the operational amplifier being responsive to at least the common mode voltage and the programmable voltage to reduce a common mode error of the signal received by the output nodes, wherein the differential amplifier circuit comprises a plurality of differential pairs of devices, individual ones of the plurality of differential pairs of devices being selectively enabled to generate a differential signal on the differential output node based at least in part on the signals on the first and second input node, and wherein a voltage swing and a common mode voltage of the differential signal vary based on at least a programmable voltage signal on the regulated voltage supply node and programmable currents flowing through the loads.

35. An apparatus comprising:

means for selecting an output standard from a plurality of output standards, individual ones of the output standards including an output common mode voltage and an output voltage swing;

means for controlling an output common mode voltage of differential output nodes based at least in part on a selected output standard; and means for controlling an output voltage swing of the differential output nodes based at least in part on the selected output standard, wherein at least one of the means for controlling the output common mode voltage and the means for controlling the output voltage swing comprises a plurality of differential pairs of devices selectively coupled by respective ones of a plurality of switch circuits to the differential output nodes.

36. The apparatus, as recited in claim 35, further comprising:

means for reducing a common mode error of the output common mode voltage.

37. The apparatus, as recited in claim 35, wherein the output standard is selected from an LVPECL standard, an LVDS standard, and a CML standard.

38. The apparatus, as recited in claim 35, wherein the output standard is a high impedance output state.

* * * * *

UNITED STATES PATENT AND TRADEMARK OFFICE
CERTIFICATE OF CORRECTION

| | | |
|---|---|---|
| PATENT NO. | : 7,145,359 B2 | Page 1 of 1 |
| APPLICATION NO. | : 10/878197 | |
| DATED | : December 5, 2006 | |
| INVENTOR(S) | : Jerrell P. Hein, Bruce P. Del Signore and Akhil K. Garlapati | |

It is certified that error appears in the above-identified patent and that said Letters Patent is hereby corrected as shown below:

In col. 10, line 59, please delete "p1" and being a new paragraph before "forming".

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,145,359 B2 | Page 1 of 1 |
| APPLICATION NO. | : 10/878197 | |
| DATED | : December 5, 2006 | |
| INVENTOR(S) | : Jerrell P. Hein, Bruce P. Del Signore and Akhil K. Garlapati | |

It is certified that error appears in the above-identified patent and that said Letters Patent is hereby corrected as shown below:

In col. 10, line 59, please delete "p1" and begin a new paragraph before "forming".

This certificate supersedes Certificate of Correction issued March 6, 2007.

Signed and Sealed this

Eighth Day of May, 2007

JON W. DUDAS
*Director of the United States Patent and Trademark Office*